United States Patent
Fowers et al.

(10) Patent No.: US 10,795,678 B2
(45) Date of Patent: Oct. 6, 2020

(54) MATRIX VECTOR MULTIPLIER WITH A VECTOR REGISTER FILE COMPRISING A MULTI-PORT MEMORY

(71) Applicant: Microsoft Technology Licensing, LLC, Redmond, WA (US)

(72) Inventors: Jeremy Fowers, Seattle, WA (US); Kalin Ovtcharov, Issaquah, WA (US); Eric S. Chung, Woodinville, WA (US); Todd Michael Massengill, Woodinville, WA (US); Ming Gang Liu, Kirkland, WA (US); Gabriel Leonard Weisz, Bethesda, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 111 days.

(21) Appl. No.: 15/959,209

(22) Filed: Apr. 21, 2018

(65) Prior Publication Data

US 2019/0324748 A1    Oct. 24, 2019

(51) Int. Cl.
*G06F 9/30*       (2018.01)
*G06F 3/06*       (2006.01)
(Continued)

(52) U.S. Cl.
CPC ........ *G06F 9/30036* (2013.01); *G06F 3/0613* (2013.01); *G06F 3/0656* (2013.01);
(Continued)

(58) Field of Classification Search
CPC ............. G06F 9/30036; G06F 9/30109; G06F 9/30134
See application file for complete search history.

(56) References Cited

U.S. PATENT DOCUMENTS 7,635,987 B1    12/2009  Agarwal
2004/0172517 A1*  9/2004  Prokopenko ........ G06F 9/30032
                                                                                                                712/4

(Continued)

FOREIGN PATENT DOCUMENTS

WO        0217071  A1    2/2002

OTHER PUBLICATIONS

Farabet, et al., "Cnp: An Fpga-Based Processor for Convolutional Networks", In Proceedings of IEEE International Conference on Field Programmable Logic and Applications, FPL, Aug. 31, 2009, 6 Pages.

(Continued)

*Primary Examiner* — Jacob Petranek
(74) *Attorney, Agent, or Firm* — Ranjeev Singh; Singh Law, PLLC

(57) ABSTRACT

Neural network processors including a vector register file (VRF) having a multi-port memory and related methods are provided. The processor may include tiles to process an N by N matrix of data elements and an N by 1 vector of data elements. The VRF may, in response to a write instruction, store N data elements in a multi-port memory and during each one of out of P clock cycles provide N data elements to each one of P input interface circuits of the multi-port memory comprising an input lane configured to carry L data elements in parallel. During the each one of the P clock cycles the multi-port memory may be configured to receive N data elements via a selected at least one of the P input interface circuits. The VRF may include output interface circuits for providing N data elements in response to a read instruction.

20 Claims, 5 Drawing Sheets

(51) Int. Cl.
*G11C 7/10* (2006.01)
*G11C 8/16* (2006.01)

(52) U.S. Cl.
CPC .......... *G06F 3/0659* (2013.01); *G06F 9/3001* (2013.01); *G11C 7/1078* (2013.01); *G11C 8/16* (2013.01)

(56) References Cited

U.S. PATENT DOCUMENTS

| | | | | |
|---|---|---|---|---|
| 2004/0193839 | A1* | 9/2004 | Kirsch | G06F 7/785 |
| | | | | 712/4 |
| 2004/0243657 | A1* | 12/2004 | Goren | G06E 1/045 |
| | | | | 708/607 |
| 2011/0153707 | A1* | 6/2011 | Ginzburg | G06F 9/3001 |
| | | | | 708/523 |
| 2017/0371657 | A1* | 12/2017 | Mahurin | G06F 3/061 |
| 2018/0247190 | A1* | 8/2018 | Chung | G06N 3/0481 |

OTHER PUBLICATIONS

He, et al., "Deep Residual Learning for Image Recognition", In Journal of the Computing Research Repository, Dec. 10, 2015, pp. 1-12.

Morgan, Timothy P., "Drilling Into Microsoft's Brainwave Soft Deep Learning Chip", Retrieved from <<https://www.nextplatform.com/2017/08/24/drilling-microsofts-brainwave-soft-deep-leaning-chip/>>, Aug. 24, 2017, 8 Pages.

Yiannacouras, et al., "VESPA: Portable, Scalable, and Flexible FPGA-Based Vector Processors", In Proceedings of the International Conference on Compilers, Architectures and Synthesis for Embedded Systems, Oct. 19, 2008, 10 Pages.

Yu, et al., "Vector Processing as a Soft-core CPU Accelerator", In Proceedings of the 16th International Symposium on Field Programmable Gate Arrays, Feb. 24, 2008, 10 Pages.

"International Search Report and Written Opinion Issued in PCT Application No. PCT/US2019/026205", dated Aug. 2, 2019, 10 Pages.

* cited by examiner

MATRIX VECTOR MULTIPLIER WITH A VECTOR REGISTER FILE COMPRISING A MULTI-PORT MEMORY

BACKGROUND

Neural network technology is used to perform complex tasks such as reading comprehension, language translation, image recognition, or speech recognition. Machine learning services, such as those based on Recurrent Neural Networks (RNNs), Convolution Neural Networks (CNNs), Long Short Term Memory (LSTM) neural networks, or Gated Recurrent Units (GRUs) have been deployed to perform such complex tasks. While these types of neural networks have been deployed, there is a need for continued improvement in the underlying architecture and corresponding instructions to perform these complex tasks.

SUMMARY

In one example, the present disclosure relates to a processor comprising a vector register file including a multi-port memory (e.g., a dual-port memory). The processor may further include a plurality of tiles configured to process a N by N matrix of data elements and an N by 1 vector of data elements, where N is an integer equal to or greater than 8, and where each of the plurality of tiles is configured to process N data elements. The vector register file may be configured to, in response to a write instruction, during a single clock cycle store N data elements in the multi-port memory and during each one of out of P clock cycles provide N data elements to each one of P input interface circuits of the multi-port memory, where P is an integer equal to N divided by L, where L is an integer equal to or greater than 2, and where each of the P input interface circuits comprises an input lane configured to carry L data elements in parallel, and where during the each one of the P clock cycles the multi-port memory is configured to receive N data elements via a selected at least one of the P input interface circuits.

The vector register file may further be configured to, in response to a read instruction, during a single clock cycle retrieve N data elements from the multi-port memory and during each one of out of Q clock cycles provide L data elements from each one of Q output interface circuits of the multi-port memory, where Q is an integer equal to N divided by L, and where each of the Q output interface circuits comprises an output lane configured to carry L data elements in parallel, and where during the each one of the Q clock cycles the multi-port memory is configured to provide N data elements to a selected at least one of the Q output interface circuits.

In another example, the present disclosure relates to a method in a system comprising a plurality of tiles and a vector register file comprising a dual-port memory, where each of the plurality of tiles is configured to process an N by N matrix of data elements and an N by 1 vector of data elements, where N is an integer equal to or greater than 8, and where each of the plurality of tiles is configured to process N data elements.

The method may include, in response to a write instruction, during a single clock cycle storing N data elements in the dual-port memory and during each one of out of P clock cycles providing N data elements to each one of P input interface circuits of the dual-port memory, where P is an integer equal to N divided by L, where L is an integer equal to or greater than 2, and where each of the P input interface circuits comprises an input lane configured to carry L data elements in parallel, and where during the each one of the P clock cycles the dual-port memory is configured to receive N data elements via a selected one of the P input interface circuits.

The method may further include, in response to a read instruction, during a single clock cycle retrieving N data elements from the dual-port memory and during each one of out of Q clock cycles providing L data elements from each one of Q output interface circuits of the dual-port memory, where Q is an integer equal to N divided by L, and where each of the Q output interface circuits comprises an output lane configured to carry L data elements in parallel, and where during the each one of the Q clock cycles the dual-port memory is configured to provide N data elements to a selected one of the Q output interface circuits.

In yet another example, the present disclosure relates to a processor comprising a vector register file comprising a dual-port memory including a single read port and a single write port. The processor may further comprise a plurality of tiles configured to process an N by N matrix and an N by 1 vector, where N is an integer equal to or greater than 8, and where each of the plurality of tiles is configured to process N data elements.

The vector register file may be configured to, in response to a write instruction, during a single clock cycle store N data elements in the dual-port memory via the single write port and during each one of out of P clock cycles provide N data elements to each one of P input interface circuits of the dual-port memory, where P is an integer equal to N divided by L, where L is an integer equal to or greater than 2, and where each of the P input interface circuits comprises an input lane configured to carry L data elements in parallel, and where during the each one of the P clock cycles the dual-port memory is configured to receive N data elements via a selected one of the P input interface circuits.

The vector register file may further be configured to, in response to a read instruction, during a single clock cycle retrieve N data elements from the dual-port memory via the single read port and during each one of out of Q clock cycles provide L data elements from each one of Q output interface circuits of the dual-port memory, where Q is an integer equal to N divided by L, and where each of the Q output interface circuits comprises an output lane configured to carry L data elements in parallel, and where during the each one of the Q clock cycles the dual-port memory is configured to provide N data elements to a selected one of the Q output interface circuits.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
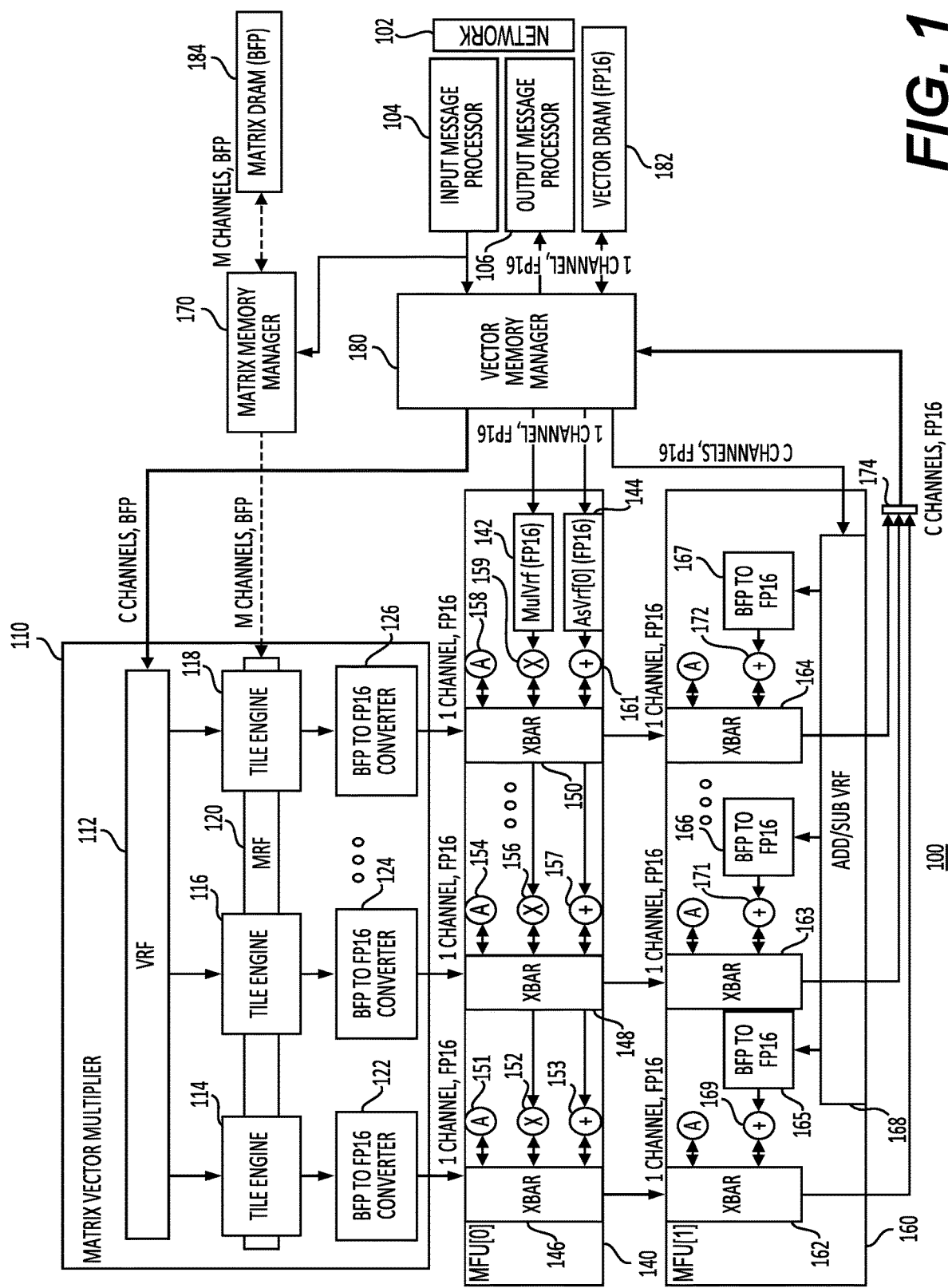
FIG. 1 is a block diagram of a processor in accordance with one example.

Examples disclosed in the present example relate to a processor including a matrix vector multiplier having a vector register file. The vector register file may be used to read/write vector data from/to the matrix vector multiplier. Certain examples relate to using a multi-port memory, for example a dual-port memory, with input interface circuits and output interface circuits that allow the dual-port memory that may have a single write port and a single read port to be used in a fast and efficient manner to perform neural network computations.

Convolutional Neural Networks (CNNs) and Recurrent Neural Networks (RNNs) are both widely used computational kernels in mainstream machine learning. CNNs and RNNs may be efficiently expressed in terms of matrix-vector multiplication, however the parallelism and data structures inherent to each differs significantly. Therefore, it is challenging to produce a single tera-flop scale computer architecture that efficiently computes both CNNs and RNNs This problem is compounded when real time latency requirements are placed on the design. As a result, previous solutions have specialized for CNNs or RNNs without prioritizing strong performance on both. Certain examples disclosed in the present disclosure relate to using system, methods, and components that provide for efficient computation for both CNNs and RNNs.

As an example, the present disclosure describes a processor that leverages the parallelism between individual output activations in a CNN to perform a limited form of matrix-matrix multiplication within an individual CNN evaluation. This parallelism is mapped onto a circuit in the form of an array of quasi-independent matrix-vector multiplication tile engines that receive the same matrix data but different vector data. This approach allows for high utilization at batch=1 for CNN inputs, which in turn delivers high throughput at low latency. One of the ways enable this approach is the use of a multi-port vector register file (VRF), which allows many simultaneous vectorized reads and writes to a shared memory space. This approach is also enabled by a CNN-aware instruction set architecture (ISA) that provides an information-dense expression of CNNs in the same assembly level code that can be used to express RNNs.

The processors described in this disclosure may be implemented using portions or combinations of Field Programmable Gate Arrays (FPGAs), Application Specific Integrated Circuits (ASICs), Erasable and/or Complex programmable logic devices (PLDs), Programmable Array Logic (PAL) devices, and Generic Array Logic (GAL) devices. An image file may be used to configure or re-configure the processors, such as FPGAs. The image file or similar file or program may be delivered via a network link or a local link (e.g., PCIe) from a host CPU. Information included in an image file can be used to program hardware blocks of a processors (e.g., logic blocks and reconfigurable interconnects of an FPGA) to implement desired functionality. Desired functionality can be implemented to support any service that can be offered via a combination of computing, networking, and storage resources such as via a data center or other infrastructure for delivering a service.

In one example, processors (e.g., FPGAs) or groups of such processors may be coupled to each other via a low latency network. A converged platform leveraging hundreds to thousands of such processors (e.g., FPGAs) may advantageously offer: (1) significantly reduced training times from exploiting parallelism across hundreds of thousands of nodes, (2) enabling new training scenarios such as online learning in-situ on live data, and (3) training models of unprecedented scale while leveraging flexible and fungible homogeneous FPGA resources in a hyper-scale datacenter spanning hundreds of thousands of servers. In one example, such advantages may be obtained by exploiting unconventional data representations that may leverage the architecture of processors, such as FPGAs.

The described aspects can also be implemented in cloud computing environments. Cloud computing may refer to a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly. A cloud computing model can be composed of various characteristics such as, for example, on-demand self-service, broad network access, resource pooling, rapid elasticity, measured service, and so forth. A cloud computing model may be used to expose various service models, such as, for example, Hardware as a Service ("HaaS"), Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth.

Machine learning services, such as those based on Recurrent Neural Networks (RNNs), Convolution Neural Networks (CNNs), Long Short Term Memory (LSTM) neural networks, or Gated Recurrent Units (GRUs) may be implemented using the processors described in this disclosure. In one example, the service-related content or other information, such as words, sentences, images, videos, or other such content/information may be translated into a vector representation. The vector representation may correspond to techniques such as RNN, CNN, LSTM, or GRU. The deep learning models may be trained off-line before service initialization and then may be deployed using the systems and processors described in this disclosure.

In one example, the neural network model may comprise of many layers and each layer may be encoded as matrices or vectors of weights expressed in the form of coefficients or constants that have been obtained via off-line training of a neural network. Programmable hardware logic blocks in the nodes may process the matrices or vectors to perform various operations, including multiply, add, and other operations against input vectors representing encoded information related to the service. In one example, the matrices or vectors of weights may be partitioned and pinned across multiple nodes by using techniques such as graph partitioning. As part of this process, a large neural network may be translated into an intermediate representation (e.g., a graph) and then the intermediate representation may be carved into smaller representations (e.g., sub-graphs) and each of the matrices of weights corresponding to each sub-graph may be pinned to a node's on-chip memories. In one example, the models may be translated into fixed-size matrices and vectors. This way, the nodes' resources may operate on the fixed-size matrices and vectors in parallel.

Taking the LSTM example, an LSTM network may comprise a sequence of repeating RNN layers or other types of layers. Each layer of the LSTM network may consume an input at a given time step, e.g., a layer's state from a previous time step, and may produce a new set of outputs or states. In case of using the LSTM, a single chunk of content may be encoded into a single vector or multiple vectors. As an example, a word or a combination of words (e.g., a phrase, a sentence, or a paragraph) may be encoded as a single vector. Each chunk may be encoded into an individual layer (e.g., a particular time step) of an LSTM network. An LSTM layer may be described using a set of equations, such as the ones below:

$$i_t = \sigma(W_{xi}x_t + W_{hi}h_{t-1} + W_{ci}c_{t-1} + b_i)$$

$$f_t = \sigma(W_{xf}x_t + W_{hf}h_{t-1} + W_{cf}c_{t-1} + b_f)$$

$$c_t = f_t c_{t-1} + i_t \tan h(W_{xc}x_t + W_{hc}h_{t-1} + b_c)$$

$$o_t = \sigma(W_{xo}x_t + W_{ho}h_{t-1} + W_{co}c_t + b_o)$$

$$h_t = o_t \tan h(c_t)$$

In this example, inside each LSTM layer, the inputs and hidden states may be processed using a combination of vector operations (e.g., dot-product, inner product, or vector addition) and non-linear functions (e.g., sigmoids, hyperbolic, and tangents). In certain cases, the most compute intensive operations may arise from the dot products, which may be implemented using dense matrix-vector and matrix-matrix multiplication routines. In one example, the processing of the vector operations and non-linear functions may be performed in parallel.

In one example, individual processors may send messages comprising packets directly to each other and thus this may allow the partitioning of even a single neural network across multiple processors without incurring unacceptable latencies. For communicating the processors may use a lightweight protocol, including, for example, RDMA. Parallelization could also be performed within a layer of a neural network by splitting neural weights across multiple processors. As an example, a single CNN or RNN model (e.g., including LSTM weight matrices) may be partitioned and processed using processors.

FIG. 1 is a block diagram of a processor 100 in accordance with one example. Each processor 100 may include an Input Message Processor (IMP) 104 for receiving messages from other processors and an Output Message Processor (OMP) 106 for processing outgoing messages to other processors or components. Such messages may be received and transmitted via network 102. Each processor 100 may further include a matrix vector multiplier (MVM) 110, two or more multifunction units (MFUs) (e.g., MFU[0] 140 and MFU[1] 160). Each processor 100 may further include a matrix memory manager 170, a vector memory manager 180, a Vector DRAM 182, and a Matrix DRAM 184. In this example, the processor may accept off-chip messages containing auxiliary information such as control and scalar data and payload data (e.g., vectors, matrices, or other tensor data structures). In this example, the incoming messages may be handled by a lightweight input message processor (IMP) 104, which sends the vectors to vector memory manager 180. IMP 104 may send the matrices to matrix memory manager 170.

With continued reference to FIG. 1, each of the matrices may have a N by N size and each of the vectors may have a size of N by 1. In this example, all instructions corresponding to processor 100 may operate on native-sized data. Logical vectors and matrices corresponding to the applications handled by processor 100 may often be larger than the native size; in these cases, the vectors and matrices are broken up into native-sized tiles. In one example, for matrix vector multiplication, matrix data and vector data may be expressed in block floating point (BFP) format. In this example, the block size of the BFP format data may be equal to the native dimension. Therefore, each native N by 1 vector may have a shared exponent, and each row of an N by N matrix may have a shared exponent. The shared exponent may be 5 bits. Each of the vector data and the matrix data may have a two's complement mantissa portion, and the mantissa size for the vector data and the matrix data may be different.

MVM 110 may include a vector register file (VRF) 112, a matrix register file (MRF) 120, and tile engines (e.g., tile engines 114, 116, and 118). Tile engines may receive input matrix and input vector data from VRF 112. MVM 110 may further include format converters, as needed, including block floating point (BFP) to floating point (FP) converters. In one example, two internal BFP formats may be used by MVM 110 for expressing its input and output: BFP short, for vector and matrix storage, and BFP long for accumulation. In one example of MVM 110, BFP short may use 81.15 fixed point values with a shared 5 bit exponent, and BFP long may use q34.40 fixed point values with a shared 5 bit exponent. In this example, the matrix-vector multiplication may result in BFP long, which may be converted back to a floating-point format as a final output stage. Thus, the example MVM 110 shown in FIG. 1 may include BFP to FP16 Converters 122, 124, and 126 at the output stages. Tile engines 114, 116, and 118 may, in parallel, provide outputs to the respective converters as shown in the example in FIG. 1. Additional details regarding MVM 110 are provided in FIG. 2 and additional details of VRF 112 are provided in FIGS. 3 and 4.

The matrix data may be communicated between Matrix DRAM 184 and Matrix Memory manager 170 using M number of channels. Vector memory manager may move vector data to over C number of channels.

With continued reference to FIG. 1, each MFU (e.g., MFU[0] 140 and MFU[1] 160) may include crossbars (e.g., crossbars labeled as xbars). MFU[0] 140 may support vector operations, such as vector-vector multiply and addition, a Sigmoid function, a Tan H function, a softmax operation, a Rectified Linear Unit (ReLU) operation, and/or an activation block operation. Thus, as shown in FIG. 1, MFU[0] 140 may include crossbars (e.g., xbar 146, 148, and 150) that may stream a vector from its input bus through a pipelined sequence of operations. Thus, a vector may be received via a register file labeled MulVrf 142 or another register file labeled AsVrf[0] 144, and such vectors may be subjected to any of a multiply operation, an addition operation, or some other operation. MFU[0] 140 may include several hardware blocks for performing addition (e.g., 153, 157, and 161). MFU[0] 140 may also include several hardware blocks for performing multiplication (e.g., 152, 156, and 159). MFU[0] 140 may also include several hardware blocks for performing activation (e.g., 151, 154, and 158).

Still referring to FIG. 1, MFU[1] 160 may include crossbars (e.g., xbar 162, 163, and 164) that may allow MFU[1] 160 to receive outputs from MFU[0] 140 and perform additional operations on those outputs and any additional inputs received via ADD/SUB VRF 168. MFU[1] 160 may include several hardware blocks for performing addition (e.g., 169, 171, and 172). MFU[1] 160 may also include several hardware blocks for performing activation. The outputs from MFU[1] 160 received via C channels may be coupled via a multiplexing circuit 174 to vector memory manager 180. Although FIG. 1 shows a certain number of components of processor 100 arranged in a certain manner, there could be more or fewer number of components arranged differently.

Processor 100 may be used to enable issuance of instructions that can trigger millions of operations using a small number of instructions. As an example, Table 1 below shows instructions corresponding to a fully parameterized LSTM:

TABLE 1

```
void LSTM (int steps) {
    for (int t = 0; t < steps; t++) {
        v_rd (s , NeqQ, DONTCARE) ;
        v_wr (s , InitialVrf , 1stm → ivrf_xt) ;
        // xWF = xt * Wf + bf
        v_rd (s, InitialVrf , 1stm → ivrf_xt);
        mv_mul (s , 1stm → mrf_Wf) ;
        vv_add (s , 1stm → asvrf_bf) ;
        v_wr (s , AddSubVrf , 1stm → asvrf_xWf) ;
        // xWi = xt * Wi + bi ...
        // xWf = xt * Wo + bo ...
        // xWc = xt * Wc + bc ...
        // f gate → multiply by c_prev
        v_rd (s , InitialVrf , 1stm → ivrf_h_prev) ;
        mv_mul (s , 1stm → mrf_Uf) ;
        vv_add (s , 1stm → asvrf_xWf) ;
        v_sigm (s) ; // ft
        vv_mul (s , 1stm → mulvrf_c_prev) ;
        v_wr (s , AddSubVrf , 1stm → asvrf_ft_mod) ;
        // i gate ...
        // o gate ...
        // c gate → store ct and c_prev
        v_rd (s , InitialVrf , 1stm → ivrf_h_prev) ;
        mv_mul (s , 1stm → mrf_Uc) ;
        vv_add (s , 1stm → asvrf_xWc) ;
        v_tanh (s) ;
        vv_mul (s , 1stm → mulvrf_it) ;
        vv_add (s , 1stm → asvrf_ft_mod) ; // ct
        v_wr (s , MultiplyVrf , 1stm → mulvrf_c_prev) ;
        v_wr (s , InitialVrf , 1stm → ivrf_ct) ;
        // produce ht, store and send to network
        v_rd (s , InitialVrf , 1stm → ivrf_ct) ;
        v_tanh (s) ;
        vv_mul (s , 1stm → mulvrf_ot) ; // ht
        v_wr (s , InitialVrf , 1stm → ivrf_h_prev) ;
        v_wr (s , NetQ , DONTCARE) ;
    }
}
```

Although Table 1 shows a certain number of instructions having a certain format, processor 100 may execute more or fewer instructions having a different format to accomplish the same objectives.

Table 2 below shows how to compute a 1×1 convolution as part of a CNN evaluation.

TABLE 2

```
SetIterations(bs, args->iterations);
SetRowsCols(bs, 1, args->cols);
// Compute
v_rd_inc(bs, ISA_Mem_MvmInitialVrf, mvuivrf_input, args->cols);
mv_mul(bs, mrf_weights);
vv_add_inc(bs, ISA_Mem_AddSubVrf_0, asvrf0_bias, 0);
vv_add_inc(bs, ISA_Mem_AddSubVrf_1, asvrf1_residual, 1);
v_relu(bs);
v_wr_inc(bs, ISA_Mem_NetOutputQ, DONTCARE, DONTCARE).
```

As shown in the table above, the number of iterations over a chain of instructions for the computation may be specified. Next, as needed, the native dimension of each instruction chain may be scaled by a column scaling factor. And after reading the vector data from the vector register file it may be multiplied with the weights retrieved from the matrix register file. After performing additional operations as required by the CNN evaluation, the output may be provided. As an example, a pointwise Rectified Linear Unit (ReLU) operation may be performed for each element of the vector data.

Table 3 below shows how to compute an N×N convolution as part of a CNN evaluation. The instructions below that are similar to the 1×1 convolution are not described again. The Set2dWindows instruction may be used to set the total window size and then SetIterations instruction may be used to slide that window across the input volume. The *_inc instructions (e.g., v_rd_inc and v_add_inc) may be used to increment the instruction's address based on the stride. As an example, a stride of 2 may result in skipping of every other vector in the vector register file that is used to store vector data for operations, such as addition.

TABLE 3

```
SetRowsCols(bs, 1, args->windowCols * args->windowCols * args-
>volumeDepth);
Set2dWindow(bs, args->windowCols * args->volumeDepth, input_cols);
SetIterations(bs, output_cols);
for (unsigned imageRow = 0; imageRow < output_rows; imageRow++)
{
    for (unsigned filter = 0; filter < args->filterCount; filter++)
    {
        v_rd_inc(bs, ISA_Mem_MvmInitialVrf, ivrf_input +
        imageRow * args->windowStride * input_cols, args->volumeDepth *
        args- >windowStride);
            mv_mul(bs, mrf_weights + filter * args->windowCols * args-
        >windowCols * args->volumeDepth);
            vv_add_inc(bs, ISA_Mem_AddSubVrf_0, asvrf0_bias +
        filter, 0);
            v_relu(bs);
            v_wr_inc(bs, ISA_Mem_Dram, dram_buffer_wr_ptr + filter,
        output_depth);
    }
    dram_buffer_wr_ptr += output_cols * output_depth;
}
```

Figure 2:
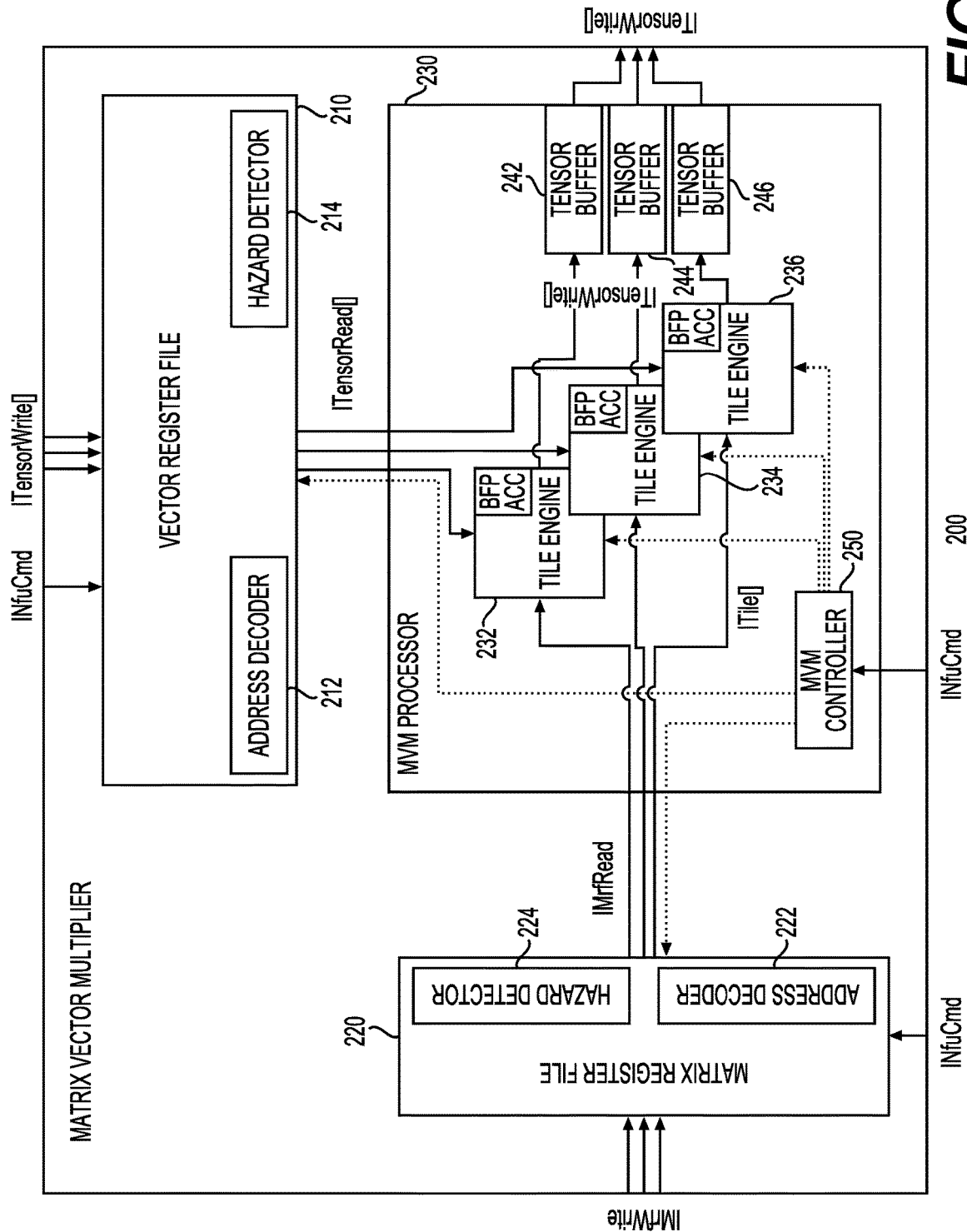
FIG. 2 is a block diagram of a matrix-vector multiplier unit in accordance with one example.

FIG. 2 is a block diagram of a matrix-vector multiplier (MVM) 200 in accordance with one example. In this example, MVM 200 may be used to implement MVM 110 of FIG. 1. MVM 200 may include a vector register file (VRF) 210, a matrix register file (MRF) 220, and an MVM processor 230. VRF 210 may further include an address decoder 212 and a hazard detector 214. VRF 210 may receive both commands and vector data, such as tensors. MRF 220 may include an address decoder 222 and a hazard detector 224. MRF 220 may receive both commands and matrix data. MVM processor 230 may include tile engines 232, 234, and 236. MVM processor 230 may also include buffers for receiving and providing tensors (e.g., tensor buffers 242, 244, and 246). MVM processor 230 may further include an MVM controller 250. In this example, MVM 200 may instantiate a series of tile engines, each of which may be designed to accelerate a native-sized MVM. In this example, each tile engine is made up of a series of dot product units (DPUs), such that each dot product unit may be responsible for the dot product computation that corresponds to one native row in the matrix tile. In one example, when processor 100 is implemented using an FPGA, a small set of BRAMs and DSPs may be configured to create a tile engine. As an example, each may include block random-access memories (BRAMs) and processing logic blocks (e.g., digital signal processors (DSPs)). Processing logic blocks may be used to multiply an input vector with a row of weights. The output of processing logic blocks may be added using an adder. Thus, in this example, each tile may perform a point-wise dot product operation. The dot product units may be composed of lanes of parallel multipliers that may feed into an accumulation tree. These lanes may provide parallelism within the columns of a row of a matrix tile. In this manner, MVM 200 may exploit at least four dimensions of parallelism: inter-MVM, MVM tiling, across the rows of a tile, and within the columns of the row. In this example, the total throughput of an MVM may be expressed as: FLOPs per cycle=2*# tile units*# DPUs*# lanes.

MRF 220 may include several matrix register files that may be configured to supply matrix data or elements to dot product units within each tile. Each multiplier may receive one vector element from VRF 210 per cycle and one matrix element from one of the matrix register files per cycle. The matrix elements may be delivered by a dedicated port of the matrix register file positioned adjacent to that multiplier. MRF 220 may be organized as follows: stored matrices may be divided into native-sized tiles and each tile nay be stored in only a single tile engine. The matrix stored in a given tile engine may be viewed as an MRF bank. Each dot product unit may be associated with a sub-bank of the MRF that holds one row of each matrix tile in that MRF bank. Rows may be statically assigned to dot product units, such that the first dot product unit contains the first row of every matrix tile in the MRF bank. Finally, the elements of the row may be interleaved in an SRAM such that the SRAM read port can be directly connected to multiplier lanes by wires alone. The writes to the matrix register file may be handled differently since matrix data for writing to MRF 220 may come from off-chip memory, such as DRAM. Although FIG. 2 shows a certain number of components of MVM 200 arranged in a certain manner, there could be more or fewer number of components arranged differently.

Figure 3:
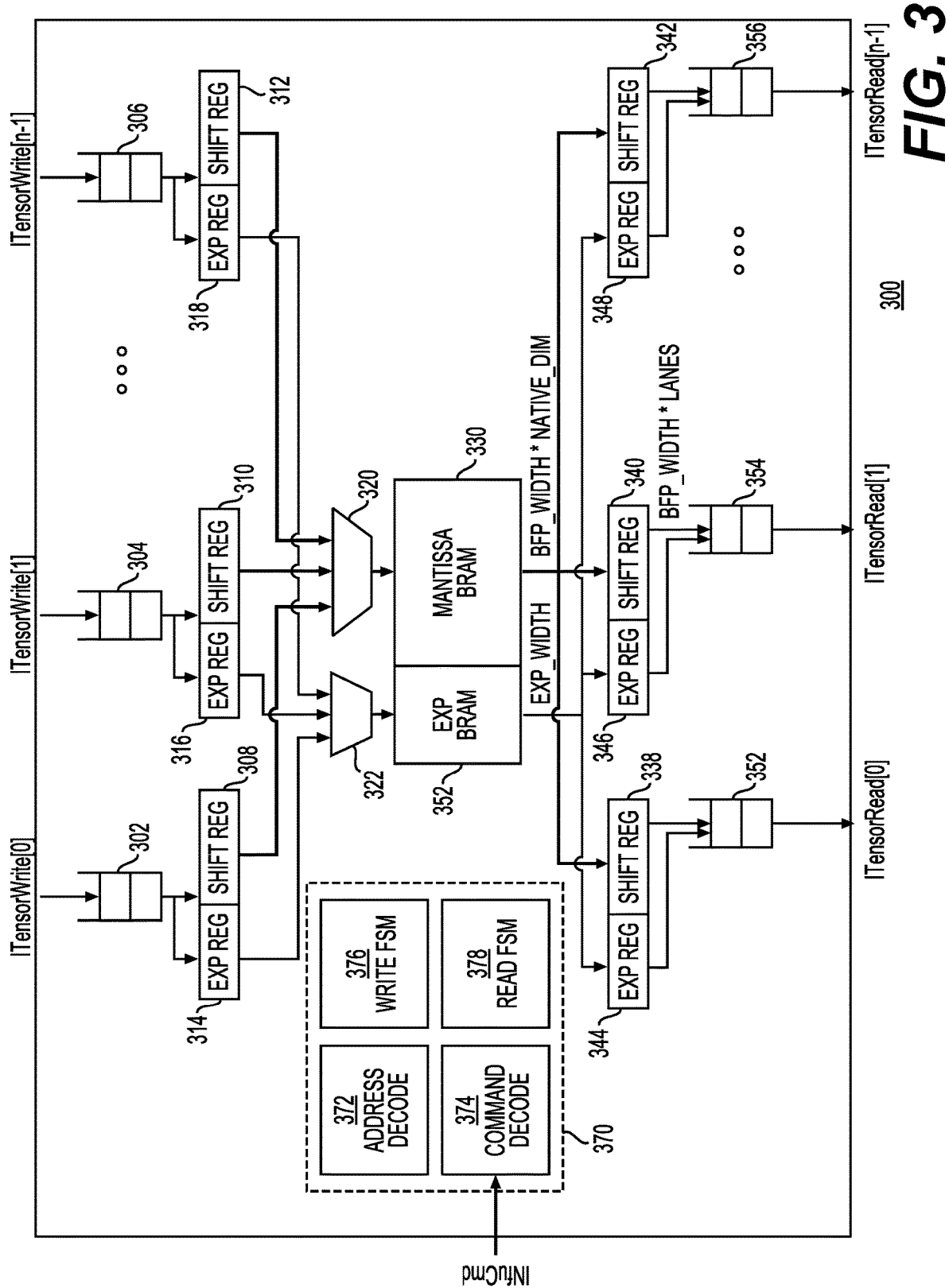
FIG. 3 is a block diagram of a vector register file in accordance with one example.

FIG. 3 is a block diagram of a vector register file (VRF) 300 in accordance with one example. VRF 300 may be used to implement at least a portion of VRF 112 of FIG. 1. VRF 300 may also be used to implement at least a portion of VRF 210 of FIG. 2. In this example, the read/write data interfaces to the VRF 300 may consist of a set of ITensorRead and ITensorWrite interfaces, each of which may read/write LANES of data elements per cycle. Each interface may follow a tensor protocol and may be independently backpressured. VRF 300 read/write interfaces may include input buffers 302, 304, and 306 and output buffers 352, 354, and 356. In response to a write operation, the input buffers may be used to receive tensors (e.g., input vector data corresponding to a layer of a neural network). In this example, VRF 300 may process vector data in a block-floating point (BFP) format. The exponent (e.g., a shared exponent) may be stored in exponent registers (e.g., EXP REGs 314, 316, and 318) and the mantissa may be stored in shift registers (e.g., SHIFT REGs 308, 310, and 312). The outputs of the exponent registers may be coupled to a multiplexer 322 and the outputs of the shift registers may be coupled to a multiplexer 320, which may be written to a memory (e.g., a block RAM (BRAM)). Thus, the exponent may be written to EXP BRAM 352 and the mantissa may be written to MANTISAA BRAM 330. In response to a read, data from the memory may be output to output interfaces. Thus, the exponents may be output to exponent registers (e.g., EXP REGs 344, 346, and 348) and the mantissa may be output to shift registers (e.g., SHIFT REGs 338, 340, and 342). From these registers the BFP vector data may be provided to output buffers (e.g., buffers 352, 354, and 356). Control logic 370 may control the movement of the vector data through the various components of VRF 300, including for example, multiplexers 320 and 322. Control logic 370 may include address decoding (e.g., ADDRESS DECODE 372), command decoding (e.g., via COMMAND DECODE 374), and read/write control (e.g., via READ FSM 378 and WRITE FSM 376). Thus, upon receipt of a command and address via INfuCmd bus, the command and the address may be decoded to determine the address access pattern and port selection. Table 4 below shows command fields or parameters that may be decoded by control logic 370.

TABLE 4

-is_write: specifies whether the command is a read or write operation
-vrf_addr: provides address of the first native vector to be read
-increment: the number of addresses to increment on each iteration (this value may be defined by the v_rd_inc, v_wr_inc or vv_add_inc instructions).
-batch: specifies the number of consecutive native vectors to read or write, forming a logical vector (in one example, this may be specified via the tileRows or tileCols parameters).
-iterations: specifies the number of times the command chain executes.
-window_cols: specifies the number of native vectors in a single row of the 2D window.
-window_offset: provides the address offset into the next row in the window.

In one example, control logic associated with processor 100 may decode the parameters specified in Table 2 to determine both the native vector address and the interface to read from or write to. Modules connected to VRF 300 may be required to decode the commands and these parameters in the same way such that these modules may read/write the correct data at the appropriate interface and in the appropriate order into or out of VRF 300.

In one example, this may be accomplished using a hierarchical decode and dispatch architecture. Thus, in a case where processor 100 is implemented based on an FPGA, a control processor may be realized using an off-the-shelf Nios II/f processor that is paired with custom code. A top-level scheduler associated with the control processor may receive a stream of instructions that may be grouped in chains. After decoding the instructions, the top-level scheduler may dispatch distributed control signals to a set of second-level schedulers and to another set of second-level decoders. These second-level schedulers and decoders may dispatch additional distributed control signals to the lowest level decoders. In the example implementation using the Nios processor, the Nios processor may stream T iterations of N instructions into the top-level scheduler. Next, the top-level scheduler may dispatch the MVM-specific portion of instructions to a second-level scheduler, which may expand operations along the target matrix's N rows and N columns. These MVM schedules may be mapped to E matrix-vector tile engines and the operations may be dispatched to a set of E decoders each for the tile engines and their associated vector register files and accumulation units. The set of E decoders may generate control signals that fan out into the data plane, with each tile engine dispatcher fanning out to hundreds of dot product units that may read the vector data from the vector register file and write the vector data back to the vector register file.

In terms of read/write operations, in this example, VRF 300 may internally use a multi-port memory (e.g., a dual-port BRAM) of data width NATIVE_DIM*BFP_WIDTH+EXP_WIDTH. In one example, the dual-port memory (e.g., the BRAM) may rotate to serve the data at a different interface circuit each cycle. Thus, in this example, in steady state, VRF 300 may achieve full read/write bandwidth with no port conflicts. Although FIG. 3 shows a certain number of components of VRF 300 arranged in a certain manner, there could be more or fewer number of components arranged differently. As an example, although the dual-port memory is described as a BRAM, other types of memories in other types of processors may also be used. As an example, SRAM or other types of dual-port memories in GPUs, CPUs, or other types of processors may also be used. In addition, although FIG. 3 describes a dual-port memory (one port for reading and one port for writing), a memory with additional ports may also be used; for example, a memory with two read ports and two write ports may be used.

Figure 4:
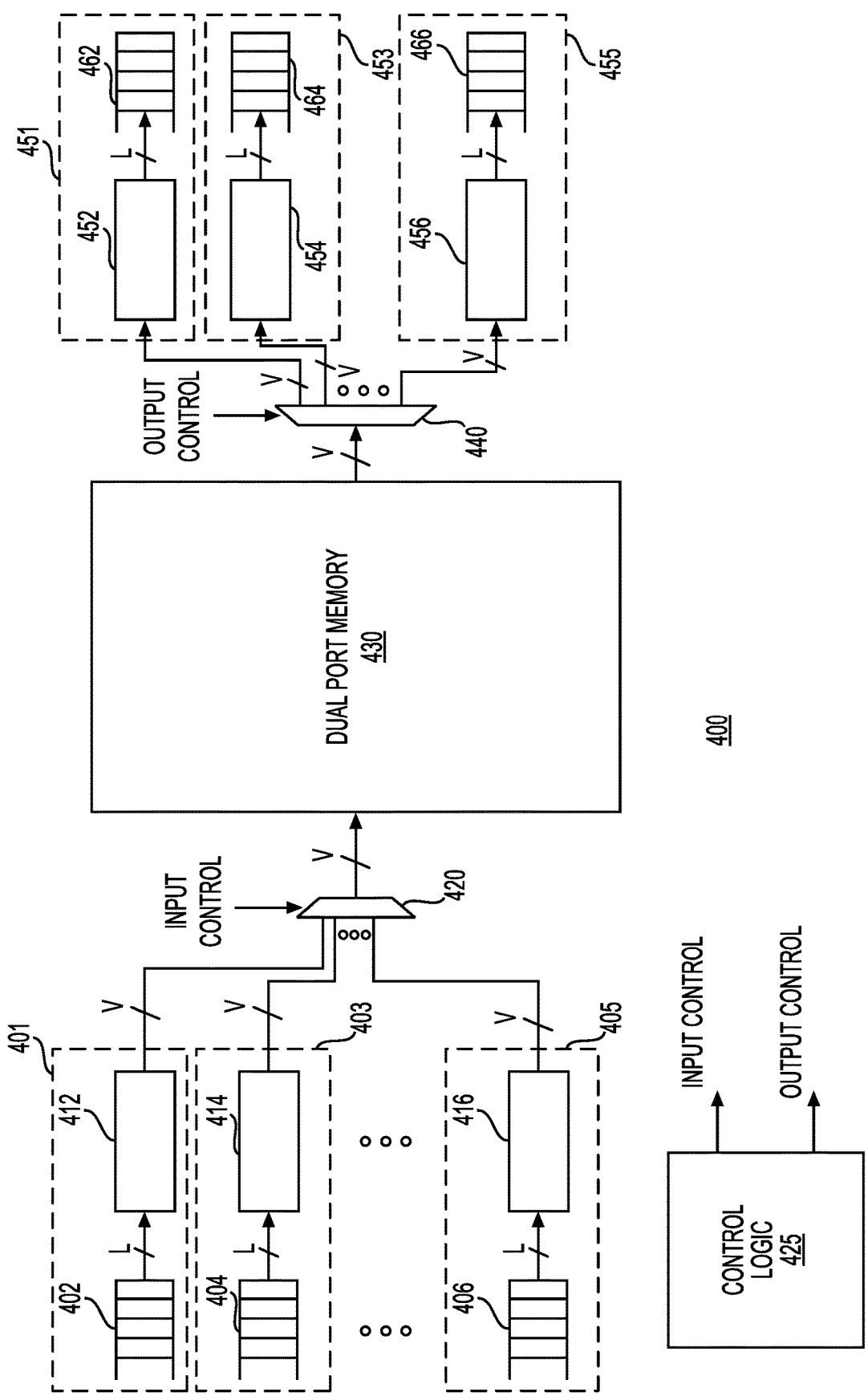
FIG. 4 is a block diagram of a vector register file in accordance with another example.

FIG. 4 is a block diagram of a vector register file 400 in accordance with another example. This example has been simplified to explain the operation of a vector register file (e.g., VRF 300 of FIG. 3) including dual-port memory 430. This example assumes that the native dimension N of a vector or matrix is 128 words. Thus, a matrix vector multiplier may multiply an N×N matrix with an N×1 vector as part of the neural network processing. This example further assumes that each element is a word, which is W bits wide. This example further assumes that each dot product unit can process L-words (or L-elements) of vector and matrix data that will produce a partial dot-product. The MVM may include an add-reduction tree to accumulate the partial dot-products. The add-reduction output may then be provided to an accumulator that sums all partial sums to provide the final dot-product for an entire row of a matrix. VRF 400 may receive vector data via eight interfaces, where each interface has L lanes. VRF 400 write interface may have input interface circuits, including for example input interface circuit 401, input interface circuit 403, and input interface circuit 405. VRF 400 read interface may have output interface circuits, including for example output interface circuit 451, output interface circuit 453, and output interface circuit 455. Each input interface circuit may include an input buffer (e.g., input buffers 402, 404, and 406) and each output interface circuit may include an output buffer (e.g., output buffers 462, 464, and 466). The input buffers may further be coupled to additional interface elements (e.g., interface elements 412, 414, and 416). The output buffers may further be coupled to additional output interface elements (e.g., output interface elements 452, 454, and 456). The write interface may further comprise a multiplexer 420, which may be coupled to receive the outputs from each of the input interface circuits. The output of multiplexer 420 may be coupled to a read port of dual-port memory 430. The read interface may further comprise a de-multiplexer 440, which may be coupled to receive the output from dual-port memory 430. The outputs from de-multiplexer may be coupled to the output interface circuits.

In response to a write operation, the input interface circuits may be used to receive tensors and in response to a read operation, the output interface circuits may provide the vector data. In this example, in response to a write instruction, during a single clock cycle, N data elements may be stored in the dual-port memory via a wide interface (labeled V in FIG. 4). During each one out of P (N/L) clock cycles VRF 400 may receive via each input interface one of the tensors (e.g., one N by 1 vector). In the example shown in FIG. 4, P=8, N=128 and L=16. Assuming each data element is a word, which has W bits, every eight clock cycles each input interface circuit may receive N multiplied by W bits (V bits). In this example, N is 128 and assuming the word size is 4 bits, every clock cycle VRF 400 may store 512 bits. During every clock cycle L (e.g., 16 in this case) input lanes that are part of input interface circuits may carry L data elements (e.g., L words) in parallel. Shift registers (e.g., shift registers 412, 414, and 416) that are part of the input interface circuits may provide 512 bits every clock cycle to multiplexer 420.

Similarly, in response to a read instruction, every eight clock cycles VRF 400 may provide V bits (512 bits), via a V-bit wide read port, to at least one of the output interface circuits via multiplexer 440. Shift registers (e.g., shift registers 452, 454, and 456) may provide L data elements per clock cycle to the respective output buffer. The read and write instructions may be scheduled to execute simultaneously. Thus by "rotating" dual-port memory 430 from interface to interface, every clock cycle an entire vector with a native dimension of N may be read from and written to VRF 400. This may advantageously allow processor 100 to be based on an FPGA or another type of hardware node that has limited amount of SRAM, such as the limited amount of BRAM in an FPGA. This may be advantageous because the matrix vector multiplication could be designed to scale up to the majority of the FPGA's resources and without wasting the FPGA's resources to provide for dedicated multi-port BRAMs. Control logic 425 may provide control signals, such as INPUT CONTROL and OUTPUT control. More details regarding the control aspect of VRF 400 are provided with respect to FIG. 3 and other description. Although FIG. 4 describes the operation of VRF 400 using N×N sized 2D matrices and N-length 1D vectors, VRF 400 may be operated using other sizes as well. The selection of the vector size may depend on the target set of models—selecting a vector too large may cause suboptimal padding, whereas selecting a vector too small may increase the control overhead of the processor. In addition, although FIG. 4 describes the operation of VRF 400 using a dual-port memory, the memory may have additional read/write ports.

Figure 5:
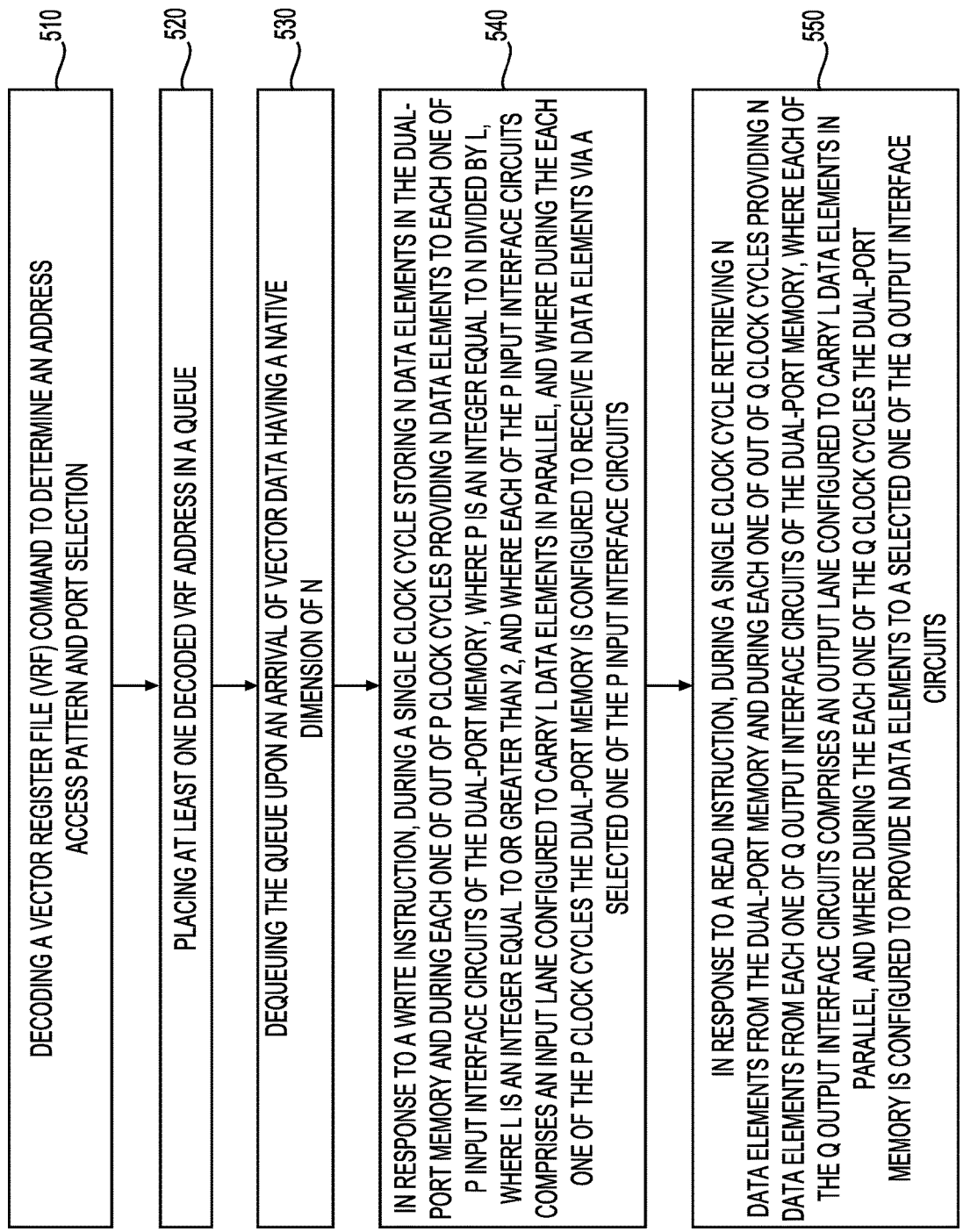
FIG. 5 shows a flow diagram of a method for processing vector data elements using the processor of FIG. 1 and a vector register file in accordance with one example.

FIG. 5 shows a flow diagram of a method for processing vector data elements using the processor and the vector register file in accordance with one example. In this example, the step 510 may include decoding a vector register file (VRF) command to determine an address access pattern and port selection. Command decode 374 may perform this step. As described earlier, in one example, this may be accomplished using a hierarchical decode and dispatch architecture. Thus, in a case where processor 100 is implemented based on an FPGA, a control processor may be realized using an off-the-shelf Nios II/f processor that is paired with custom code. A top-level scheduler associated with the control processor may receive a stream of instructions that may be grouped in chains. After decoding the instructions, the top-level scheduler may dispatch distributed control signals to a set of second-level schedulers and to another set of second-level decoders. These second-level schedulers and decoders may dispatch additional distributed control signals to the lowest level decoders. In the example implementation using the Nios processor, the Nios processor may stream T iterations of N instructions into the top-level scheduler. Next, the top-level scheduler may dispatch the MVM-specific portion of instructions to a second-level scheduler, which may expand operations along the target matrix's N rows and N columns. These MVM schedules may be mapped to E matrix-vector tile engines and the operations may be dispatched to a set of E decoders each for the tile engines and their associated vector register files and accumulation units. The set of E decoders may generate control signals that fan out into the data plane, with each tile engine dispatcher fanning out to hundreds of dot product units that may read the vector data from the vector register file and write the vector data back to the vector register file.

In addition, because it is possible to have Read-After-Write (RAW) or Write-After-Read (WAR) hazards in the vector register file hazard detection may be used. Thus, in one example, the hazard detector (e.g., 214 of FIG. 2) may keep track of the addresses accessed by the read or write instructions, and when a read instruction arrives and there is a write in progress, hazard detector may check whether the addresses accessed by the incoming read instruction overlap with the addresses accessed by the current write instruction. In one example, hazard detector may accomplish by maintaining a pair of registers to keep track of a certain number of addresses accessed by these instructions.

Step 520 may include placing at least one decoded VRF address in a queue. In this example, address decode 372 may perform this step.

Step 530 may include dequeuing the queue upon an arrival of vector data having a native dimension of N. Control logic 370 associated with VRF 370 may perform this step.

Step 540 may include in response to a write instruction, during a single clock cycle storing N data elements in the dual-port memory and during each one of out of P clock cycles providing N data elements to each one of P input interface circuits of the dual-port memory, where P is an integer equal to N divided by L, and where each of the P input interface circuits comprises an input lane configured to carry L data elements in parallel, and where during the each one of the P clock cycles the dual-port memory is configured to receive N data elements via a selected one of the P input interface circuits. In this example, a finite state machine (e.g., WRITE FSM 376) may perform this step. Additional details regarding this step are provided with respect to FIG. 4.

Step 550 may include in response to a read instruction, during a single clock cycle retrieving N data elements from the dual-port memory and during each one of out of the P clock cycles providing L data elements from each one of P output interface circuits of the dual-port memory, where each of the P output interface circuits comprises an output lane configured to carry L data elements in parallel, and where during the each one of the P clock cycles the dual-port memory is configured to provide N data elements to a selected one of the P output interface circuits. In this example, a finite state machine (e.g., READ FSM 378) may perform this step. Additional details regarding this step are provided with respect to FIG. 4. Although FIG. 5 describes a certain number of steps performed in a certain order, additional or fewer steps in a different order may be performed. In addition, although FIG. 5 describes the method with respect to a dual-port memory, a memory with additional ports may be used. As an example, a memory with two read ports and two write ports may be used.

In conclusion, the present disclosure relates to a processor comprising a vector register file including a multi-port memory (e.g., a dual-port memory). The processor may further include a plurality of tiles configured to process a N by N matrix of data elements and an N by 1 vector of data elements, where N is an integer equal to or greater than 8, and where each of the plurality of tiles is configured to process N data elements. The vector register file may be configured to, in response to a write instruction, during a single clock cycle store N data elements in the multi-port memory and during each one of out of P clock cycles provide N data elements to each one of P input interface circuits of the multi-port memory, where P is an integer equal to N divided by L, where L is an integer equal to or greater than 2, and where each of the P input interface circuits comprises an input lane configured to carry L data elements in parallel, and where during the each one of the P clock cycles the multi-port memory is configured to receive N data elements via a selected at least one of the P input interface circuits.

The vector register file may further be configured to, in response to a read instruction, during a single clock cycle retrieve N data elements from the multi-port memory and during each one of out of Q clock cycles provide L data elements from each one of Q output interface circuits of the multi-port memory, where Q is an integer equal to N divided by L, and where each of the Q output interface circuits comprises an output lane configured to carry L data elements in parallel, and where during the each one of the Q clock cycles the multi-port memory is configured to provide N data elements to a selected at least one of the Q output interface circuits.

In one example, the multi-port memory may be configured as a dual-port memory, and the dual-port memory may comprise a single read port and a single write port. In this example, the read instruction may be processed substantially simultaneously with the write instruction.

In one example, each of one of the P input interface circuits comprises an input buffer configured to store N by 1 vectors and each one of the Q output interface circuits comprises an output buffer configured to store N by 1 vectors. In this example, each of the P input interface circuits comprises at least one shift register coupled to receive the N by 1 vectors from the input buffer and each of the Q output interface circuits comprises at least one shift register coupled to provide the N by 1 vectors to the output buffer.

In another example, the present disclosure relates to a method in a system comprising a plurality of tiles and a vector register file comprising a dual-port memory, where each of the plurality of tiles is configured to process an N by N matrix of data elements and an N by 1 vector of data elements, where N is an integer equal to or greater than 8, and where each of the plurality of tiles is configured to process N data elements.

The method may include, in response to a write instruction, during a single clock cycle storing N data elements in the dual-port memory and during each one of out of P clock cycles providing N data elements to each one of P input interface circuits of the dual-port memory, where P is an integer equal to N divided by L, where L is an integer equal to or greater than 2, and where each of the P input interface circuits comprises an input lane configured to carry L data elements in parallel, and where during the each one of the P clock cycles the dual-port memory is configured to receive N data elements via a selected one of the P input interface circuits.

The method may further include, in response to a read instruction, during a single clock cycle retrieving N data elements from the dual-port memory and during each one of out of Q clock cycles providing L data elements from each one of Q output interface circuits of the dual-port memory, where Q is an integer equal to N divided by L, and where each of the Q output interface circuits comprises an output lane configured to carry L data elements in parallel, and where during the each one of the Q clock cycles the dual-port memory is configured to provide N data elements to a selected one of the Q output interface circuits.

In one example, the dual-port memory may comprise a single read port and a single write port. In this example, the read instruction may be processed substantially simultaneously with the write instruction.

In one example, each of one of the P input interface circuits comprises an input buffer configured to store N by 1 vectors and each one of the Q output interface circuits comprises an output buffer configured to store N by 1 vectors. In this example, each of the P input interface circuits comprises at least one shift register coupled to receive the N by 1 vectors from the input buffer and each of the Q output interface circuits comprises at least one shift register coupled to provide the N by 1 vectors to the output buffer.

In yet another example, the present disclosure relates to a processor comprising a vector register file comprising a dual-port memory including a single read port and a single write port. The processor may further comprise a plurality of tiles configured to process an N by N matrix and an N by 1 vector, where N is an integer equal to or greater than 8, and where each of the plurality of tiles is configured to process N data elements.

The vector register file may be configured to, in response to a write instruction, during a single clock cycle store N data elements in the dual-port memory via the single write port and during each one of out of P clock cycles provide N data elements to each one of P input interface circuits of the dual-port memory, where P is an integer equal to N divided by L, where L is an integer equal to or greater than 2, and where each of the P input interface circuits comprises an input lane configured to carry L data elements in parallel, and where during the each one of the P clock cycles the dual-port memory is configured to receive N data elements via a selected one of the P input interface circuits.

The vector register file may further be configured to, in response to a read instruction, during a single clock cycle retrieve N data elements from the dual-port memory via the single read port and during each one of out of Q clock cycles provide L data elements from each one of Q output interface circuits of the dual-port memory, where Q is an integer equal to N divided by L, and where each of the Q output interface circuits comprises an output lane configured to carry L data elements in parallel, and where during the each one of the Q clock cycles the dual-port memory is configured to provide N data elements to a selected one of the Q output interface circuits.

In one example, each of one of the P input interface circuits comprises an input buffer configured to store N by 1 vectors and each one of the Q output interface circuits comprises an output buffer configured to store N by 1 vectors. In this example, each of the P input interface circuits comprises at least one shift register coupled to receive the N by 1 vectors from the input buffer and each of the Q output interface circuits comprises at least one shift register coupled to provide the N by 1 vectors to the output buffer. In this example, the read instruction may be processed substantially simultaneously with the write instruction.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:
1. A processor comprising:
   a vector register file comprising a multi-port memory; and
   a plurality of tiles configured to process an N by N matrix of data elements and an N by 1 vector of data elements, wherein N is an integer equal to or greater than 8, and wherein each of the plurality of tiles is configured to process N data elements, and wherein the vector register file is configured to:

in response to a write instruction, during a single clock cycle store N data elements in the multi-port memory and during each one of out of P clock cycles provide N data elements to each one of P input interface circuits of the multi-port memory, wherein P is an integer equal to N divided by L, wherein L is an integer equal to or greater than 2, and wherein each of the P input interface circuits comprises an input lane configured to carry L data elements in parallel, and wherein during the each one of the P clock cycles the multi-port memory is configured to receive N data elements via a selected at least one of the P input interface circuits, and in response to a read instruction, during a single clock cycle retrieve N data elements from the multi-port memory and during each one of out of Q clock cycles provide L data elements from each one of Q output interface circuits of the multi-port memory, wherein Q is an integer equal to N divided by L, and wherein each of the Q output interface circuits comprises an output lane configured to carry L data elements in parallel, and wherein during the each one of the Q clock cycles the multi-port memory is configured to provide N data elements to a selected at least one of the Q output interface circuits.

2. The processor of claim 1, wherein the multi-port memory is a dual-port memory, and wherein the dual-port memory comprises a single read port and a single write port.

3. The processor of claim 1, wherein the read instruction is scheduled to execute simultaneously with the write instruction.

4. The processor of claim 1, wherein each one of the P input interface circuits comprises an input buffer configured to store N by 1 vectors.

5. The processor of claim 1, wherein each one of the Q output interface circuits comprises an output buffer configured to store N by 1 vectors.

6. The processor of claim 4, wherein each of the P input interface circuits comprises at least one shift register coupled to receive the N by 1 vectors from the input buffer.

7. The processor of claim 5, wherein each of the Q output interface circuits comprises at least one shift register coupled to provide the N by 1 vectors to the output buffer.

8. A method in a system comprising a plurality of tiles and a vector register file comprising a dual-port memory, wherein each of the plurality of tiles is configured to process an N by N matrix of data elements and an N by 1 vector of data elements, wherein N is an integer equal to or greater than 8, and wherein each of the plurality of tiles is configured to process N data elements; the method comprising:

in response to a write instruction, during a single clock cycle storing N data elements in the dual-port memory and during each one of out of P clock cycles providing N data elements to each one of P input interface circuits of the dual-port memory; wherein P is an integer equal to N divided by L, wherein L is an integer equal to or greater than 2, and wherein each of the P input interface circuits comprises an input lane configured to carry L data elements in parallel, and wherein during the each one of the P clock cycles the dual-port memory is configured to receive N data elements via a selected one of the P input interface circuits; and in response to a read instruction, during a single clock cycle retrieving N data elements from the dual-port memory and during each one of out of Q clock cycles providing L data elements from each one of Q output interface circuits of the dual-port memory, wherein Q is an integer equal to N divided by L, and wherein each of the Q output interface circuits comprises an output lane configured to carry L data elements in parallel; and wherein during the each one of the Q clock cycles the dual-port memory is configured to provide N data elements to a selected one of the Q output interface circuits.

9. The method of claim 8, wherein the dual-port memory comprises a single read port and a single write port.

10. The method of claim 8, wherein the read instruction is scheduled to execute simultaneously with the write instruction.

11. The method of claim 8, wherein each one of the P input interface circuits comprises an input buffer configured to store N by 1 vectors.

12. The method of claim 8, wherein each one of the Q output interface circuits comprises an output buffer configured to store N by 1 vectors.

13. The method of claim 11, wherein each of the P input interface circuits comprises at least one shift register coupled to receive the N by 1 vectors from the input buffer.

14. The method of claim 12, wherein each of the Q output interface circuits comprises at least one shift register coupled to provide the N by 1 vectors to the output buffer.

15. A processor comprising:

a vector register file comprising a dual-port memory including a single read port and a single write port; and a plurality of tiles configured to process an N by N matrix and an N by 1 vector, wherein N is an integer equal to or greater than 8, and wherein each of the plurality of tiles is configured to process N data elements, and wherein the vector register file is configured to:

in response to a write instruction, during a single clock cycle store N data elements in the dual-port memory via the single write port and during each one of out of P clock cycles provide N data elements to each one of P input interface circuits of the dual-port memory, wherein P is an integer equal to N divided by L, wherein L is an integer equal to or greater than 2, and wherein each of the P input interface circuits comprises an input lane configured to carry L data elements in parallel, and wherein during the each one of the P clock cycles the dual-port memory is configured to receive N data elements via a selected one of the P input interface circuits, and in response to a read instruction, during a single clock cycle retrieve N data elements from the dual-port memory via the single read port and during each one of out of Q clock cycles provide L data elements from each one of Q output interface circuits of the dual-port memory, wherein Q is an integer equal to N divided by L, and wherein each of the Q output interface circuits comprises an output lane configured to carry L data elements in parallel, and wherein during the each one of the Q clock cycles the dual-port memory is configured to provide N data elements to a selected one of the Q output interface circuits.

16. The processor of claim 15, wherein each one of the P input interface circuits comprises an input buffer configured to store N by 1 vectors.

17. The processor of claim 15, wherein each one of the Q output interface circuits comprises an output buffer configured to store N by 1 vectors.

18. The processor of claim 16, wherein each of the P input interface circuits comprises a shift register coupled to receive the N by 1 vectors from the input buffer.

19. The processor of claim 17, wherein each of the Q output interface circuits comprises a shift register coupled to provide the N by 1 vectors to the output buffer.

20. The processor of claim 15, wherein the read instruction is scheduled to execute simultaneously with the write instruction.

\* \* \* \* \*